United States Patent [19]
Proffit et al.

[11] 4,204,248
[45] May 20, 1980

[54] HEAT TRANSFER MOUNTING ARRANGEMENT FOR A SOLID STATE DEVICE CONNECTED TO A CIRCUIT BOARD

[75] Inventors: Daniel S. Proffit, Lynchburg; Maurice Regignano, Madison Heights, both of Va.

[73] Assignee: General Electric Company, Lynchburg, Va.

[21] Appl. No.: 962,094

[22] Filed: Nov. 20, 1978

[51] Int. Cl.² .............................................. H05K 7/20
[52] U.S. Cl. .................................. 361/388; 361/427; 357/81; 174/16 HS
[58] Field of Search ................. 357/81; 174/16 HS; 361/381, 386, 387, 388, 404, 405, 417, 419, 427

[56] References Cited

U.S. PATENT DOCUMENTS

| | | | |
|---|---|---|---|
| 2,947,957 | 8/1960 | Spindler | 361/386 |
| 3,487,267 | 12/1969 | Winston | 174/16 HS |
| 3,641,474 | 2/1972 | Owens | 357/81 |
| 3,665,256 | 5/1972 | Goun | 357/81 |
| 4,054,901 | 10/1977 | Edwards | 174/16 HS |

FOREIGN PATENT DOCUMENTS 911445  11/1962  United Kingdom ................ 174/16 HS

*Primary Examiner*—Gerald P. Tolin
*Attorney, Agent, or Firm*—James J. Williams

[57] ABSTRACT

A solid state device, such as a power transistor, is fastened to a mounting arrangement that provides good heat conduction to a chassis or heat sink, that holds the solid state device so that its leads can be connected to a printed circuit board without strain, and that occupies a relatively small area of the printed circuit board.

5 Claims, 3 Drawing Figures

HEAT TRANSFER MOUNTING ARRANGEMENT FOR A SOLID STATE DEVICE CONNECTED TO A CIRCUIT BOARD

BACKGROUND OF THE INVENTION

Our invention relates to a mounting arrangement for a solid state device, and particularly to such an arrangement for providing good heat transfer from the solid state device to a chassis or heat sink, and for providing connections from the solid state device to a printed circuit board without strain.

Solid state devices, particularly power transistors in radio or electronic equipment, are frequently operated under conditions (considered normal) that require that the device be attached to or in engagement with a heat conductor or sink so that the device will not overheat. At the same time, such devices must frequently be connected to a printed circuit board. Typically, the printed circuit board is an insulating material having relatively thin metallic patterns, none of which provides very good heat transfer. Furthermore, the connecting leads of the solid state device and the metallic pattern of the printed circuit board are relatively fragile, and hence must be protected against strain during the soldering operation and thereafter during normal usage.

Accordingly, a principal and relatively general object of our invention is to provide a new and improved mounting arrangement for a solid state device.

Another object of our invention is to provide a new and improved mounting arrangement for providing good heat transfer from a solid state device or power transistor to a heat sink.

Another object of our invention is to provide a new and improved mounting arrangement for a solid state device that permits the device to be connected to a printed circuit board without strain on either the solid state device or the printed circuit board patterns.

Another and fairly specific object of our invention is to provide a new and improved mounting arrangement for a solid state device, the mounting arrangement providing good heat transfer characteristics so that the solid state device will not overheat, and providing good mechanical characteristics that protect the solid state device leads and the printed circuit board pattern from strain or breakage.

Another object of our invention is to provide a new and improved solid state mounting device that provides good heat transfer from the solid state device to a chassis or heat sink, and that enables the solid state device to be readily connected to or removed from a printed circuit board pattern.

SUMMARY OF THE INVENTION

Briefly, these and other objects are achieved in accordance with our invention by a mounting device that is formed of a metallic heat conductor. The mounting device comprises a plate having projections which pass through appropriate holes in a printed circuit board pattern, and which are soldered to the pattern. The device further comprises a connecting portion which is located between the projections and which extends from the plate at an angle. The solid state device is positioned on or in close proximity to the plate and held by any suitable means. The leads of the solid state device are soldered in holes in the proper circuit patterns of the printed circuit board. The printed circuit board, with the attached mounting device and solid state device, is then positioned on the heat sink or chassis. The connecting portion of the mounting device is positioned in contact with and fastened to the heat sink or chassis. The close proximity of the solid state device and mounting arrangement, and the fastening of the connecting portion to the chassis or heat sink provide good heat conduction. The arrangement also provides a secure structure that protects the solid state device leads and the printed circuit board patterns against strain and breakage.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

DESCRIPTION OF THE PREFERRED EMBODIMENT

Figure 1:
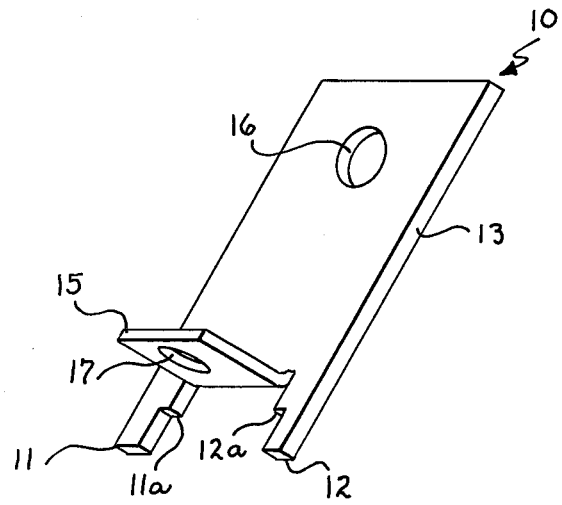
FIG. 1 is a perspective view of a preferred embodiment of an improved mounting arrangement in accordance with our invention.

FIG. 1 shows a perspective view of a preferred embodiment of our heat transfer mounting arrangement 10. Our arrangement 10 is preferably formed from a sheet of metal of good heat conducting material, such as aluminum. Our arrangement 10 comprises a substantially rectangular, relatively thin plate 13 having spaced parallel, elongated projections 11, 12 at one side. We prefer that the projection 11, 12 have respective shoulders 11a, 12a to prevent the projections 11, 12 from passing entirely through holes or openings in a printed circuit board. A metallic connecting portion 15 is positioned between the projections 11, 12 and extends at an angle (preferably 90 degrees) from the plane of the plate 13. We prefer that the plate 13, the projections 11, 12, and the connecting portion 15 be integrally formed from one sheet of metal by punching or stamping, and the portion 15 bent at substantially a right angle with respect to the plane of the plate 13. A hole or opening 16 is provided in the plate 13 for mounting a solid state device or power transistor, and a hole or opening 17 is provided in the connecting portion 15 for attaching the portion 15 to a chassis or heat sink. The arrangement 10 is preferably plated to permit the projections 11, 12 to be soldered.

Figures 2, 3:
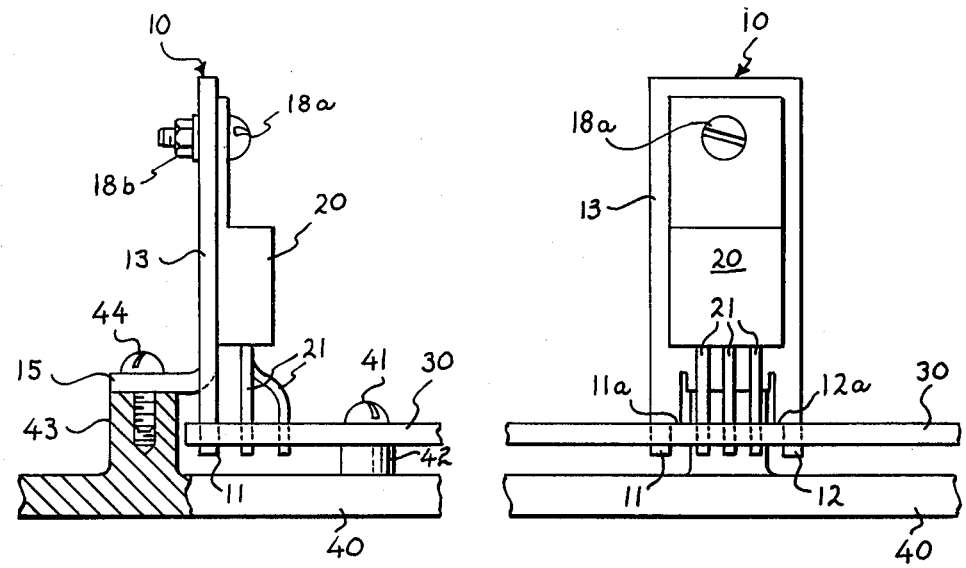
FIG. 2 is a side view, partly in cross section, of our mounting arrangement with a solid state device mounted on a printed circuit board and chassis.
FIG. 3 is a front view of our mounting arrangement with a solid state device mounted on a printed circuit board and chassis.

With respect to FIGS. 2 and 3, we show our arrangement 10 in side and front views respectively with a solid state device 20, such as a power transistor, mounted on the arrangement 10 in good heat transfer relation. The solid state device 20 can either be insulated from or placed directly against and in contact with the plate 13. The device 20 is fastened by suitable means such as a threaded screw 18a which passes through the opening 16 in the plate 13, and which is held by a nut 18b. The projections 11, 12 are passed through suitable openings in a printed circuit board 30 that has the usual holes and conducting patterns on it. The arrangement 10 is held in the proper position above the board 30 by the shoulders 11a, 12a which do not pass through the openings in the board 30, but rest on the upper surface of the board 30. The leads 21 of the solid state device 20 are also passed through suitable holes or openings in the circuit board 30. If desired, other components (not shown) are placed in suitable holes in the circuit board 30. In accordance with typical practice, the entire circuit board, with the components (not shown), the mounting arrangement 10 of our invention, and the solid state device 20, can then be soldered in accordance with typical practices. With respect to this operation, it will be noted that the projections 11, 12 and the leads 21 pass through the circuit board 30.

After the soldering operation is completed, the circuit board 30 with its soldered components can be mounted on a chassis 40 in any suitable way, such as by screws 41 which thread into suitable projections or bosses 42 on the chassis 40.

In accordance with our invention, the metallic connecting portion 15 of our arrangement 10 is positioned over and in contact with a suitable projection or boss 43 that is preferably an integral part of the chassis 40. The connecting portion 15 is securely fastened to and in good heat transfer contact with the boss 43 by a suitable threaded member or screw 44.

With an arrangement as shown in the figures in accordance with our invention, good heat transfer is provided from the solid state device 20, through the flat plate 13 of our arrangement 10, through the connecting portion 15, to the boss 43 and chassis 40, which forms a heat sink. Thus, the solid state device 20 can be operated at maximum ratings and still have good cooling through the heat conductive metal arrangement 10 in accordance with our invention. In addition, our arrangement 10 holds the solid state device 20 mechanically, and permits the device 20 to be soldered to a circuit board 30 without strain on the relatively fragile leads 21. Thereafter, the connecting portion 15 can be mechanically connected to a chassis 40 to provide good heat transfer. The exact angle of the connecting portion 15 with the plate 13 can be varied to overcome dimensional tolerances, and the hole 17 can be sufficiently large so that the screw 44 can engage the threads in the boss 43 without putting a strain on the projections 11, 12 and the leads 21 of the solid state device 20. Our arrangement 10 permits the device 20 to be removed by unsoldering the leads 21 from the circuit board 30 without unsoldering the projections 11, 12.

It will thus be seen that we have provided a new and improved arrangement which securely holds a solid state device, which also provides a good heat transfer for that device, and which occupies very little area. While we have shown only one embodiment of our invention, persons skilled in the art will appreciate the modifications that may be made. For example, if the solid state device 20 must be electrically insulated, a thin sheet of insulating material can be placed between the device 20 and the plate 13 to provide sufficient electrical insulation but at the same time permit good heat transfer. Such insulation would also require that the screw 18a be insulated from the device 20. It is also possible for the connecting portion 15 to be soldered or welded to the arrangement 10, although we prefer that it be integrally formed from the plate 13. Also, other fastening means may be used in place of the screws 18a, 44. Therefore, while our invention has been described with reference to a particular embodiment, it is to be understood that modifications may be made without departing from the spirit of the invention or from the scope of the claims.

What we claim as new and desire to secure by Letters Patent of the United States is:

1. An improved radio construction comprising:
   a. a metallic chassis;
   b. a printed circuit board mounted on said chassis, said printed circuit board having holes therethrough in which electrical leads can be placed and soldered;
   c. and a mounting arrangement for a solid state device comprising:
      1. a metallic plate extending away from said printed circuit board and having at least two spaced projections, said spaced projections extending into respective holes in said printed circuit board, and being soldered thereto;
      2. a metallic member attached to said plate in the vicinity of said spaced projections, said metallic member extending from said plate over and in contact with a portion of said chassis;
      3. means fastening said metallic member to said chassis to provide a heat path from said metallic plate through said metallic member to said chassis;
      4. and a solid state device attached to said metallic plate in heat transfer relation therewith, said solid state device having leads extending into respective holes in said printed circuit board and being soldered thereto.

2. The improved construction of claim 1 wherein said metallic member extends from said plate at substantially a right angle therewith.

3. The improved construction of claim 1 or claim 2 wherein said metallic member is an integral portion of said metallic plate.

4. The improved construction of claim 3 wherein said projections include shoulders that rest against a surface of said printed circuit board.

5. The improved construction of claim 4 wherein said solid state device physically contacts said metallic plate.

* * * * *